United States Patent [19]

Bobeck

[11] Patent Number: 4,460,976
[45] Date of Patent: Jul. 17, 1984

[54] FIELD ACCESS MAGNETIC BUBBLE MEMORY WITH IMPROVED EXPANDER-DETECTOR ARRANGEMENT

[75] Inventor: Andrew H. Bobeck, Chatham, N.J.

[73] Assignee: AT&T Bell Laboratories, Murray Hill, N.J.

[21] Appl. No.: 319,610

[22] Filed: Nov. 9, 1981

[51] Int. Cl.³ ............................................. G11C 19/08
[52] U.S. Cl. ........................................ 365/8; 365/43
[58] Field of Search .............................. 365/8, 43, 39

[56] References Cited

U.S. PATENT DOCUMENTS

| 3,810,132 | 5/1974 | Bobeck | 365/8 |
| 4,151,601 | 4/1979 | Verhulst | 365/8 |

FOREIGN PATENT DOCUMENTS 0809346  2/1981  U.S.S.R. .................. 365/8

Primary Examiner—James W. Moffitt
Attorney, Agent, or Firm—Herbert M. Shapiro

[57] ABSTRACT

A field-access magnetic bubble memory includes an improved expander-detector arrangement. An optimized element shape provides for a constant magnetic field strength at critical points in the drive field cycle. Improved high bias operation results.

3 Claims, 3 Drawing Figures

DIRECTION OF BUBBLE MOVEMENT →

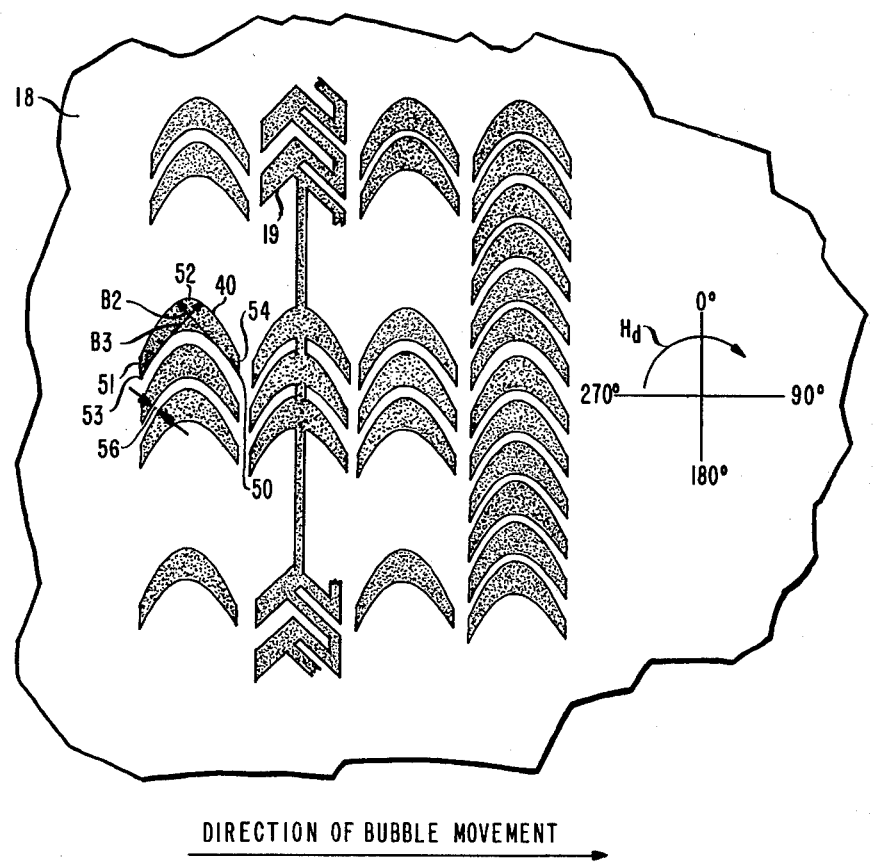

FIELD ACCESS MAGNETIC BUBBLE MEMORY WITH IMPROVED EXPANDER-DETECTOR ARRANGEMENT

TECHNICAL FIELD

This invention relates to magnetic bubble memories and, more particularly, to expander-detector arrangements for such memories.

BACKGROUND OF THE INVENTION

U.S. Pat. No. 3,618,054 of P. I. Bonyhard et al issued Nov. 2, 1971 discloses a magnetic bubble memory operative in the now familiar major-minor mode. Characteristic of memories operative in this mode is an organization of bubble propagation paths including a plurality of "minor" closed-loop paths. These loops are defined by magnetic elements, typically of permalloy, which respond to a cyclical magnetic field to move bubbles, in parallel, to a set of transfer or replicate ports. Such memories also include at least one "major" path or loop, similarly defined, in connection with which a bubble generator and expander-detector arrangement are positioned. U.S. Pat. No. 3,810,132 of A. H. Bobeck, issued May 7, 1974 discloses an expander-detector arrangement operative to detect bubbles transferred or replicated onto the major path from a selected address in the minor loops.

An expander-detector arrangement comprises a succession of stages of permalloy elements operative in response to the cyclical drive field to expand a bubble laterally with respect to the axis of the propagation path. Successive stages are defined by increasing numbers of chevron-shaped elements aligned laterally with respect to that axis. A bubble expands, as it advances along the path, to a maximum lateral dimension at a detector stage. The detector stage includes a maximum number of chevron elements interconnected into a continuous magnetoresistive detector in a well-understood manner. The detected bubble may be advanced after detection along stages having decreasing numbers of stages to reduce the detected bubble to its normal operating size for movement in a major loop back to transfer ports for return to the originating address in the minor loops. Alternatively, the detected bubble may be advanced, without reduction in size, into a guard rail for elimination. In this latter case, bubbles are replicated rather than transferred into the major path.

In either case, a limiting factor in magnetic bubble memories is failure of bubble "strip out" under high bias conditions as well as the generation of spurious bubbles under similar bias conditions. In this connection, a magnetic bubble is maintained at a nominal operating diameter by a magnetic base field antiparallel with the magnetization of a bubble and aligned with an axis normal to the plane of bubble movement. This bias field can vary from a high value at which bubbles collapse to a low value at which strip-out occurs. Under high bias conditions an elongated bubble experiences an increase in bias field strength as it moves between the ends of the elements and the peaks of the elements. This increase results in reduction of strip length which can result in the presence of spurious bubbles in the expander-detector arrangement and/or leads to a reduced signal.

BRIEF DESCRIPTION OF AN ILLUSTRATIVE EMBODIMENT

The solution to the above-noted problem is to shape adjacent chevron elements in a stage of the expander-detector so that the magnetic path across each element remains essentially of constant length (and thus the demagnetizing field remains constant) as the reorienting drive field rotates through that portion of a cycle of operation during which an elongated bubble moves across a stage. In one embodiment, each element's larger perimeter is formed as a section of arc with a center at the opposite lower terminus of the element. Also, adjacent elements of a stage are spaced apart uniformly to ensure the maximum permalloy area per unit length consistent with constant minimum processing features.

BRIEF DESCRIPTION OF THE DRAWINGS

FIG. 2 is an enlarged top view of a portion of the memory of FIG. 1 showing an expander-detector arrangement in accordance with this invention.

DETAILED DESCRIPTION

Figures 1, 3:
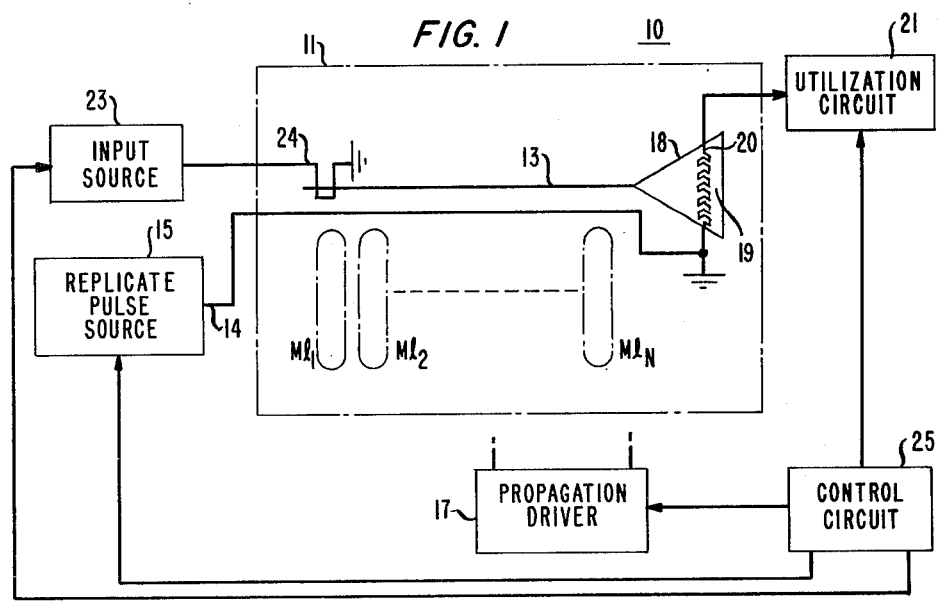
FIG. 1 is a block diagram of a magnetic bubble memory organized in the major-minor mode.
FIG. 3 is a graph of the operating margins of a memory with the expander-detector arrangement of FIG. 2.

FIG. 1 shows a magnetic bubble memory 10 including a layer 11 of a material in which magnetic bubbles can be moved. A plurality of bubble paths are defined in layer 11 by a pattern or magnetic elements. Some of the paths are shown as minor loops $Ml_1$, $Ml_2$ ... $Ml_N$. The major path is designated 13. Bubble patterns are replicated from a selected address in the minor loops into the major path in response to a replicate pulse applied to a conductor 14 by replicate pulse source 15.

A bubble pattern, so replicated, advances to the right, as viewed, along path 13 in response to a magnetic field reorienting cyclically in the plane of layer 11 in a typical field access mode of operation. Such a field is supplied by orthogonal coils (not shown) encompassing layer 11 and a suitable drive as is well known. Such apparatus is represented by block 17 in the FIG.

Path 13 terminates at expander-detector arrangement 18. The expander-detector arrangement includes a succession of stages with increasing numbers of elements (permalloy) reaching a maximum number at a detector stage 19. A magnetoresistive detector 20 occupies the detector stage and is connected between a utilization circuit 21 and ground. Bubbles replicated from a selected address in the minor loops into the major loop during a read operation advance to the right, as viewed, as the in-plane drive field rotates. During each cycle of the in-plane field, detector 19 is interrogated. If a bubble is present during that cycle, a pulse is applied to utilization circuit 21 and the bubble is annihilated by being advanced into a guard rail (not shown) as is well known.

During a write operation, bubbles in a selected address are annihilated, conveniently by a pulse of a polarity opposite to that of the replicate pulse on conductor 14. Source 15 is adaptable to apply such a pulse as is well understood in the art. Input pulse source 23 is adapted to apply a pulse to conductor 24 to generate a bubble (or no bubble) during each cycle of the in-plane field in a write operation. The resulting pattern advances along path 13 until positioned for replication into the selected address in the minor loops now vacated. The original bubble pattern, once replicated, is advanced through the detector stage for annihilation in the guard rail.

The various sources and circuits are timed and controlled by control circuit 25. A bias field source 26 also is provided for maintaining bubbles in layer 11 at a nominal operating diameter.

Detector 19 has an F-shaped geometry as can be seen from an inspection of FIG. 2. It has been found that a relatively wide leg between the arrows 30 and 31 in FIG. 2 improves the detector performance providing a high amplitude signal in a position in the in-plane field cycle which is virtually invariant with variations in the rotating field amplitude. The lengths of the legs of the detector are increased to provide adequate resistance as is well understood. For a typical detector with the improved aspect ratio, each leg is 1.8 μm width with the short leg 8 μm and the long leg 11.5 μm in length for a design period of 16 μm. At room temperature signals of 6 mV have been achieved with a detector current of 2.0 mA.

FIG. 2 also shows in detail the permalloy elements of the expander-detector arrangement which provide the advantages described herein. If we assume that the drive field ($H_d$) rotates clockwise in the plane of layer 11 from an upward direction, designated 0 degrees, then the critical portion of the movement of an elongated bubble through a stage of the expander-detector arrangement occurs between 270 degrees and 0 degrees and almost to the same extent from 0 degrees to 90 degrees. When a straight-edged chevron element is used in the arrangement, an elongated bubble jumps from the ends of the chevrons to the peaks as is well understood in the art and from there to the ends again before traversing a gap to the leading ends of the elements of the next subsequent stage. Between the ends of the elements and the peaks, the bubble essentially stalls because of an increase in the effective bias field when the drive field is oriented in intermediate directions.

As shown in FIG. 2, no straight-edged elements occur except in the detector stage. The elements of the expander portion of the expander-detector arrangement have arcuate perimeters, the larger perimeter (the upper as viewed) being defined essentially by swinging an arc from an end of an element to the peak of the element from the opposite lower terminus of the element. For example, an arc is defined by swinging a line represented by arrow B2 from the right lower teminus 50 of element 40 at end 51 to peak 52. Similarly, an arc is formed by swinging the tip of arrow B3 about terminus 53 from end 54 to peak 52. The lower perimeter of each element is formed by retaining the separation 56 between adjacent elements of a stage uniform. Each element, as a consequence of these constraints contains a maximum amount of permalloy for the available space consistent with specified minimum feature size as required by available computer aided design equipment.

The peaks of the elements are rounded where the arcs intersect to avoid sharp features at that position.

FIG. 3 shows a plot of bias field $H_b$ against drive field $H_d$. The lower curve 65 shows the upper operating limit threshold to strip out a bubble in an expander-detector arrangement using prior art chevron-shaped elements as bias and drive fields increase. Curve 66 shows the limits using an expander-detector arrangement with the elements shown in FIG. 2. It is clear that a substantiated benefit arises. This data is for an experimental expander-detector arrangement using an 8 μm period chip with bubbles of 1.7 μm in diameter. The period in the expander-detector arrangement is 16 μm to obtain the best strip-out action.

What is claimed is:

1. A magnetic bubble memory comprising a layer of magnetic material in which magnetic bubbles can be moved, a pattern of magnetic elements for moving magnetic bubbles along a multistage path therein in response to a magnetic field reorienting cyclically in the plane of said layer, said elements in each of a succession of said stages being arranged in a column along an axis transverse to said path, adjacent ones of said elements in each of said succession of stages being generally of a chevron-shaped configuration having arcuate larger upper and smaller lower perimeters and being separated from a like next adjacent element in a stage by a uniform spacing, the geometry of each of said generally chevron-shaped elements being such that the maximum magnetic path length in each of said elements remains essentially constant as an elongated bubble moves across the elements of a stage.

2. A memory in accordance with claim 1 wherein said magnetic elements are permalloy and consecutive ones of said stages have increasing numbers of elements up to a maximum at a first stage.

3. A memory in accordance with claim 2 including a detector stage following said first stage, said detector stage including a magnetoresistive detector.

* * * * *